United States Patent
Wang et al.

(10) Patent No.: US 9,859,487 B2
(45) Date of Patent: Jan. 2, 2018

(54) PRECISE-MOTION MOTOR

(71) Applicant: HON HAI PRECISION INDUSTRY CO., LTD., New Taipei (TW)

(72) Inventors: Chang-Sheng Wang, New Taipei (TW); Mi-Chien Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 456 days.

(21) Appl. No.: 14/705,400

(22) Filed: May 6, 2015

(65) Prior Publication Data

US 2016/0072409 A1    Mar. 10, 2016

(30) Foreign Application Priority Data

Sep. 9, 2014    (CN) .......................... 2014 1 0454392

(51) Int. Cl.
| | |
|---|---|
| *H01L 41/09* | (2006.01) |
| *H02K 41/02* | (2006.01) |
| *H01L 41/193* | (2006.01) |
| *F16D 63/00* | (2006.01) |
| *F16D 121/28* | (2012.01) |

(52) U.S. Cl.
CPC ............ *H01L 41/09* (2013.01); *F16D 63/008* (2013.01); *H01L 41/193* (2013.01); *F16D 2121/28* (2013.01)

(58) Field of Classification Search
CPC ...... H01L 41/09; H01L 41/193; F16D 63/008
USPC .............................. 310/12, 13, 311, 328, 800
See application file for complete search history.

(56) References Cited

U.S. PATENT DOCUMENTS

2006/0037315 A1 *    2/2006    Zanella .................. H02N 2/101
                                                                                60/527

FOREIGN PATENT DOCUMENTS

DE            102012223398 A1 *    6/2014    ................ F01L 9/04

* cited by examiner

*Primary Examiner* — Thomas Dougherty
(74) *Attorney, Agent, or Firm* — ScienBiziP, P.C.

(57) ABSTRACT

A motor includes a rotor module and a stator module. The rotor module includes electro-active polymer modules which change their physical size depending on electrical activation or deactivation. The stator module includes a base and a plurality of magnets mounted on two fixing plates of the base. The rotor module comprises a rotor and a coil. Precise displacement by the motor is obtained by electrically activating or deactivating the electro-active polymer modules.

16 Claims, 9 Drawing Sheets

PRECISE-MOTION MOTOR

FIELD

The subject matter herein generally relates to motors.

BACKGROUND

Generally, a feedback circuit is utilized to stop a motor. However, inertia remains in a moving rotor of the motor and the rotor of the motor will not immediately stop.

BRIEF DESCRIPTION OF THE DRAWINGS

Implementations of the present technology will now be described, by way of example only, with reference to the attached figures.

DETAILED DESCRIPTION

Figure 1:
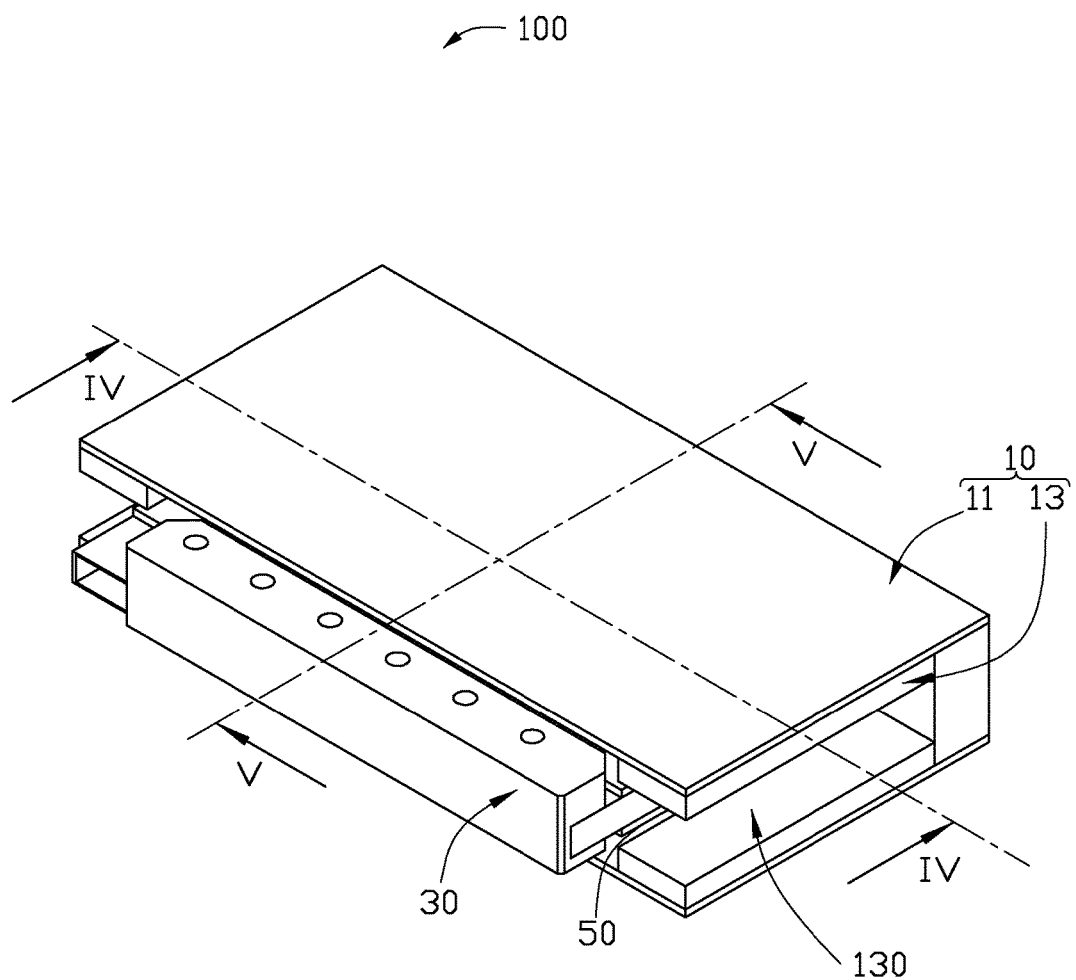
FIG. 1 is an isometric view of a first embodiment of a motor in the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "outside" refers to a region that is beyond the outermost confines of a physical object. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a chassis assembly.

Referring to FIG. 1, a motor 100 of a first embodiment includes a stator module 10, a rotor module 30, and an electro-active polymer module 50. The electronactive polymer module 50 is mounted on the rotor module 30. In the embodiment, the motor 100 is a U-shaped linear motor. The electro-active polymer module 50 is made of polyvinylidene fluoride (PVDF) or ion-exchange polymer metal composite (IPMC). The stator module 10 includes a base 11 and a plurality of magnetic dipoles 13. The base 11 is U-shaped.

Figure 2:
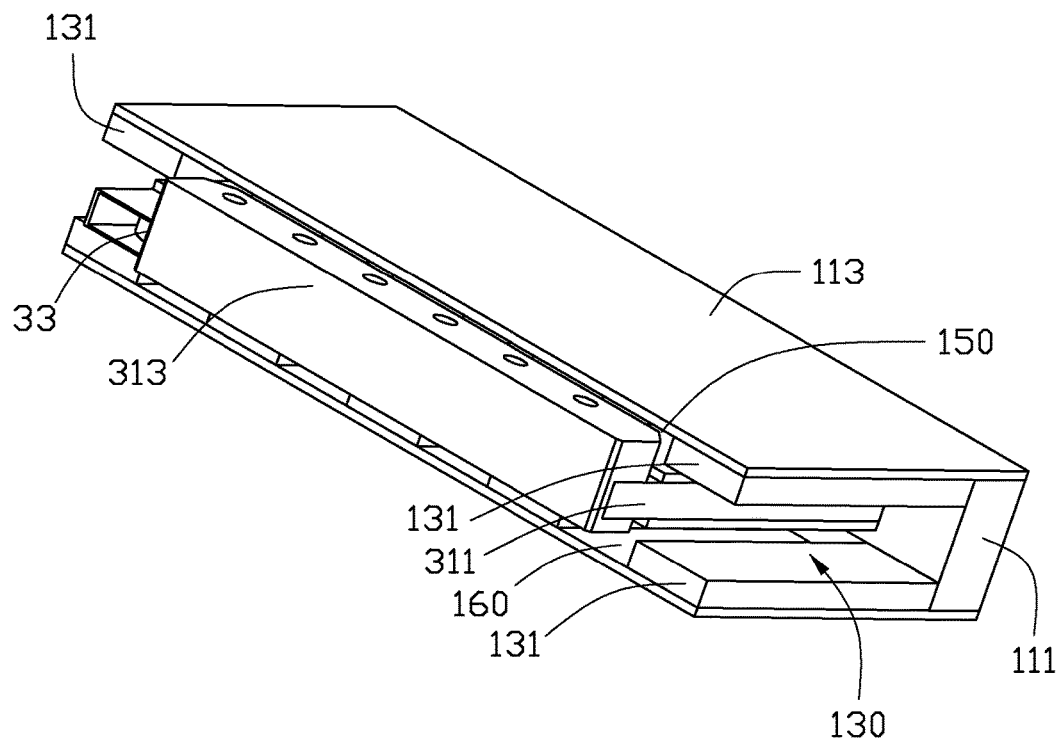
FIG. 2 is an isometric view of the motor in FIG. 1 but viewed from a different angle.

Referring to FIG. 2, the base 11 includes a substrate 111 and two fixing plates 113. The substrate 111 and the fixing plates 113 are rectangular plates. The two fixing plates 113 extend from the substrate 111. The two fixing plates 113 include a first inner surface 150 and a second inner surface 160. The base 11 can be made of stainless steel.

The plurality of magnetic dipoles 13 are uniformly mounted on the first inner surface 150 and the second inner surface 160. Each of the magnetic dipoles 13 includes two magnets 131. The two magnets 131 are parallel and oppositely mounted on the first inner surface 150 and the second inner surface 160 of the two fixing plates 113. A plurality of magnets 131 is mounted on each of the first inner surface 150 and the second inner surface 160 of the fixing plates 113. Each of the two neighboring magnets 131 presents an opposite polarity to the other. A magnetic track 130 is defined by the two fixing plates 113 and the magnets 131 mounted on the first inner surface 150 and the second inner surface 160 of the two fixing plates 113.

Figure 3:
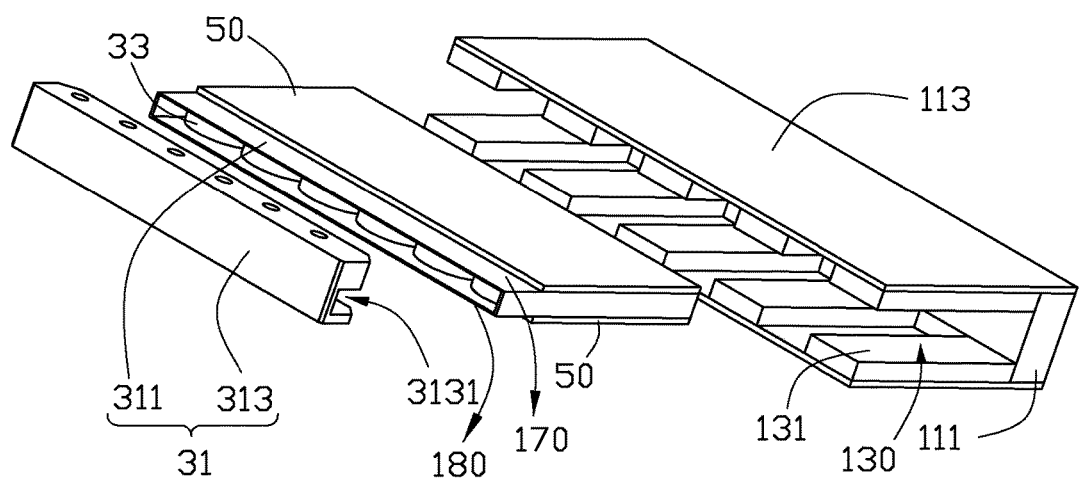
FIG. 3 is an exploded, isometric view of the motor in FIG. 1.

Referring to FIG. 3, the rotor module 30 includes a rotor 31 and a coil 33. The coil 33 is a three-phase coil and electrically connected to an outside power source (not shown). The rotor module 30 with the rotor 31 includes a sliding part 311 and a fixing part 313. The sliding part 311 is planar. The coil 33 is mounted on the sliding part 311. The sliding part 311 is inserted in the magnetic track 130. The rotor module 30 has a first outer surface 170 and a second outer surface 180 opposite, and substantially parallel to the first outer surface 170. A portion of the rotor module 30 is inserted within the stator module 10 with an inserted portion of the first outer surface 170 facing the first inner surface 150 and an inserted portion of the second outer surface 180 facing the second inner surface 160.

The fixing part 313 is U-shaped and is configured for carrying an object to be moved by the motor 100. A U-shaped opening 3131 is defined in the fixing part 313. A side of the sliding part 311 is inserted in the U-shaped opening 3131 of the fixing part 313. An electro-active polymer module 50 is mounted on the first outer surface 170 and the second outer surface 180 of the sliding part 311. When the electro-active polymer module 50 is electrically activated, the volume of the electro-active polymer module 50 is reduced. When the electro-active polymer module 50 is deactivated, the volume of the electro-active polymer module 50 expands to 380% of original volume. When the electro-active polymer module 50 is not activated, the surfaces of the sliding part 311 which carries the electro-active polymer module 50 is expanded and contacts the plurality of the magnets 131. The electro-active polymer module 50 can be electrically connected to the power source or to the coil 33.

Figure 4:
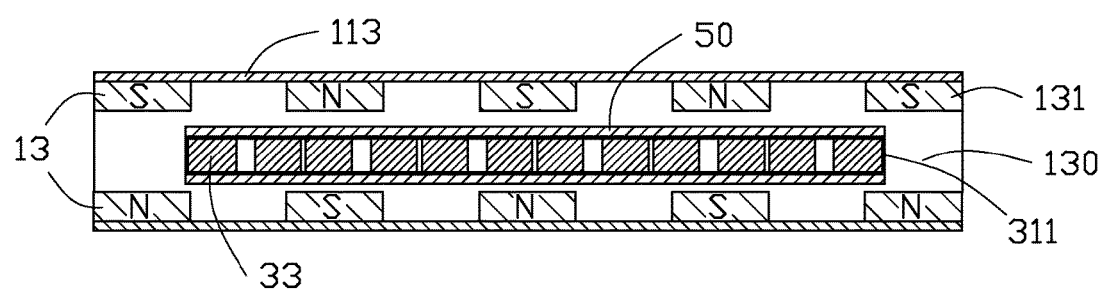
FIG. 4 is a cross-sectional view of the motor along line IV-IV of FIG. 1.

Referring to FIG. 4, in assembly, the magnetic dipoles 13 are mounted on the fixing plates 113 of the base 11. The electro-active polymer modules 50 are mounted on opposite sides (the first outer surface 170 and the second outer surface 180) of the sliding part 311 of the rotor module 31. The sliding part 311 which carries the electro-active polymer module 50 is inserted in the magnetic track 130. The sliding part 311 is between two magnets 131 of the dipoles 13.

Figure 5:
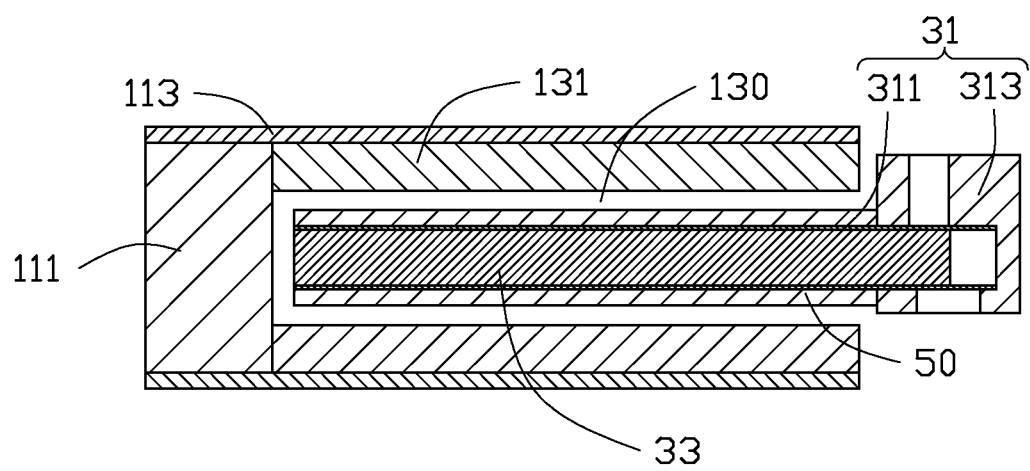
FIG. 5 is a cross-sectional view of the motor along line V-V of FIG. 1.
Figure 6:
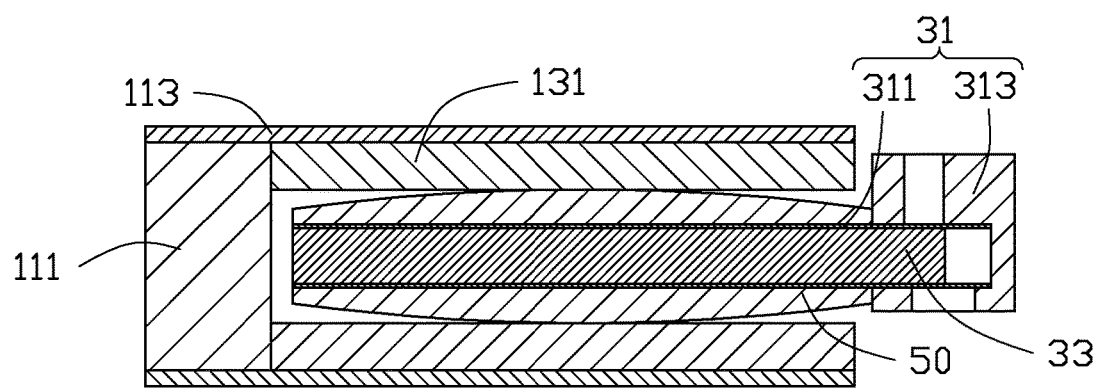
FIG. 6 is a cross-sectional view of the motor in FIG. 1 in operation.

Referring to FIG. 5 and FIG. 6, in operation, an object (not shown) is mounted on the fixing part 313. The coil 33 of the rotor module 31 is connected to electrical power and the electro-active polymer module 50 is activated. The rotor module 31 slides along the magnetic track 130.

When the sliding part 311 of the rotor module 31 is in a predetermined position in the magnetic track 130, the electro-active polymer module 50 is deactivated and the volume of electro-active polymer module 50 expands to 380% of the original volume, thus the electro-active polymer module 50 contacts the magnets 131 of the fixing plates 113. The rotor module 31 thus stops immediately and precisely because of frictional force between the electro-active polymer module 50 and the magnets 131.

Figure 7:
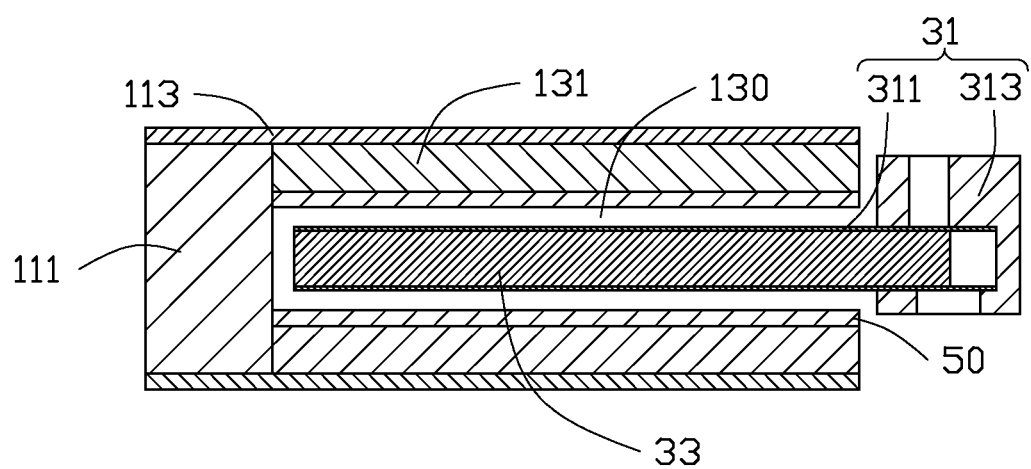
FIG. 7 is a cross-sectional view of a second embodiment of a motor.

Referring to FIG. 7, a motor 100 of the second embodiment of the present disclosure is different from the motor 100 of the first embodiment in that the electro-active polymer module 50 is mounted on the plurality of magnetic dipoles 13. When the motor 100 is in operation, the electro-active polymer module 50 is activated and the rotor module 31 slides along the magnetic track 130. When the electro-active polymer module 50 is deactivated, the electro-active polymer module expands to make contact with the rotor 31 causing the rotor 31 to immediately stop.

Figure 8:
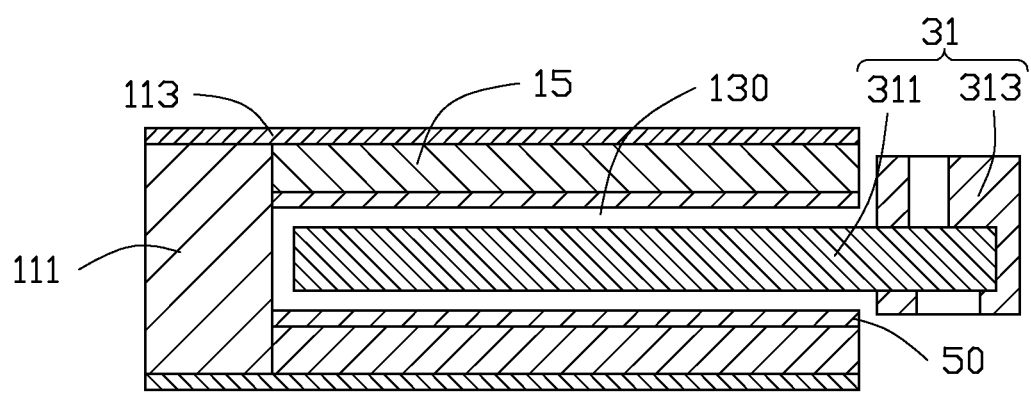
FIG. 8 is a cross-sectional view of a third embodiment of a motor.

Referring to FIG. 8, a motor 100 of a third embodiment in the present disclosure is different from the motor 100 of the first embodiment in that the motor 100 of the third embodiment in the present disclosure does not include magnetic dipoles 13. The motor 100 of the third embodiment includes two coils 15. A coil 15 is mounted on each of the two fixing plates 113 of the base 11. The rotor module 30 only includes a rotor 31. The sliding part 311 of the rotor 31 is made of permanent magnets. The rotor module 31 does not include a 3-phase coil. The electro-active polymer module 50 is mounted on the coil 15 of the two fixing plates 113.

Figure 9:
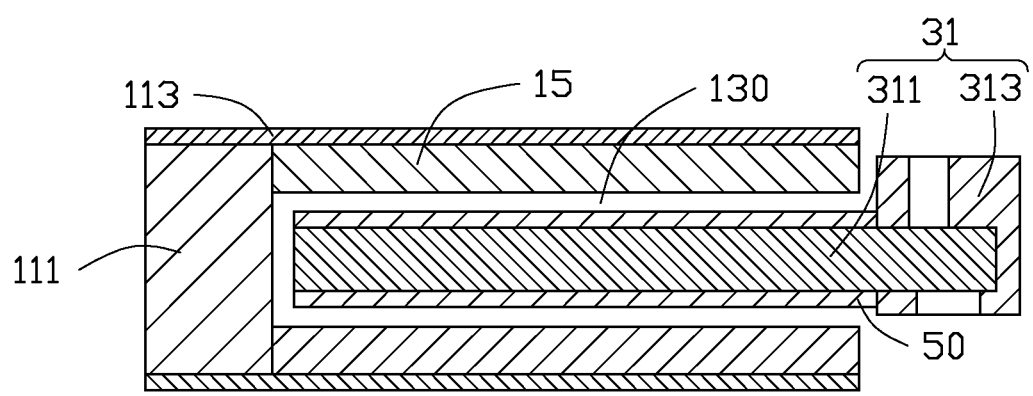
FIG. 9 is a cross-sectional view of a fourth embodiment of a motor.

Referring to FIG. 9, a motor 100 of a fourth embodiment of the present disclosure differs from the motor 100 of the first embodiment in that the motor 100 of the fourth embodiment does not include magnetic dipoles 13. The coils 15 are mounted on the fixing plates 113 of the base 11. The rotor module 30 only includes the rotor 31. The sliding part 311 of the rotor 31 is a permanent magnet and does not includes a coil. The electro-active polymer modules 50 are mounted on the two sides of the sliding part 311 of the rotor 31. When the motor 100 is in operation, the electro-active polymer module 50 is activated and the rotor module 31 slides along the magnetic track 130. When the electro-active polymer module 50 is deactivated, the electro-active polymer module expands to make contact with the coils 15 causing the rotor 31 to immediately stop.

In all the above embodiments, the motor 100 is a motor and the electro-active polymer module 50 is made of PVDF or IPMC.

The embodiments shown and described above are only examples. Many details are often found in the art such as the other features of a precise-motion motor. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A motor comprising:
   a substantially planar stator module having a first inner surface opposite, and substantially parallel to, a second inner surface;
   a substantially planar rotor module with a first outer surface and a second outer surface opposite, and substantially parallel to the first outer surface; and
   an electro-active polymer module;
   wherein, a portion of the rotor module is inserted within the stator module with an inserted portion of the rotor first outer surface facing the stator first inner surface and an inserted portion of the rotor second outer surface facing the stator second inner surface;
   wherein, the electro-active polymer module is positioned on at least a portion of one of the rotor first outer surface inserted portion and the rotor second outer surface inserted portion; and
   wherein, the electro-active polymer module is activated when electric power is connected to the motor and the electro-active polymer module is de-activated when the electric power is disconnected from the motor.

2. The motor of claim 1, wherein the stator module comprises a plurality of magnets mounted on the stator first inner surface and the stator second inner surface.

3. The motor of claim 2, wherein a magnetic track is defined by the magnets on the stator first inner surface and the stator second inner surface, the rotor module is inserted and moved in the magnetic track, the rotor module comprises a rotor and a coil.

4. The motor of claim 3, wherein the rotor module comprises a sliding part and a fixing part, the coil is mounted into the sliding part, the sliding part is inserted in the magnetic track.

5. The motor of claim 1, wherein the stator module comprises a base and a coil mounted on the base, the rotor module comprises a rotor, the rotor is made of permanent magnets.

6. The motor of claim 1, wherein the volume of electro-active polymer module expands to 380% of the original volume when the electro-active polymer module is deactivated.

7. The motor of claim 1, wherein the electro-active polymer module 50 is made of PVDF or IPMC.

8. A motor comprising:
   a substantially planar U-shaped stator having a first inner surface opposite, and substantially parallel to, a second inner surface;
   a substantially planar rotor module with a first outer surface and a second outer surface opposite, and substantially parallel to the first outer surface; and
   an electro-active polymer module;
   wherein a portion of the rotor module is inserted within the stator module with an inserted portion of the rotor first outer surface facing the stator first inner surface and an inserted portion of the rotor second outer surface facing the stator second inner surface;
   wherein, the electro-active polymer module is positioned on at least a portion of the stator module; and
   wherein, the electro-active polymer module is activated when electric power is connected to the motor and the electro-active polymer module is de-activated when the electric power is disconnected from the motor.

9. The motor of claim 8, wherein the stator module comprises a plurality of magnets mounted on the stator first inner surface and the stator second inner surface.

10. The motor of claim 9, wherein at least one electro-active polymer module mounted between the two neighboring magnets of the stator module, the rotor module comprises a rotor and a coil.

11. The motor of claim 9, wherein at least one electro-active polymer module mounted on the magnets of the stator module, the rotor module comprises a rotor and a coil.

12. The motor of claim 9, wherein a magnetic track is defined by the magnets on the stator first inner surface and the stator second inner surface, the rotor module is inserted and moved in the magnetic track, the rotor module comprises a rotor and a coil.

13. The motor of claim 12, wherein the rotor module comprises a sliding part and a fixing part, the coil is mounted into the sliding part, the sliding part is inserted in the magnetic track.

14. The motor of claim 8, wherein the stator module comprises a base and a coil mounted on the base, the rotor module comprises a rotor, the rotor is made of permanent magnets.

15. The motor of claim 8, wherein the volume of electro-active polymer module expands to 380% of the original volume when the electro-active polymer module is deactivated.

16. The motor of claim 8, wherein the electro-active polymer module 50 is made of PVDF or IPMC.

* * * * *